US012512787B2

(12) United States Patent
Kim

(10) Patent No.: US 12,512,787 B2
(45) Date of Patent: Dec. 30, 2025

(54) ELECTRICAL CONNECTOR AND SOLAR CELL MODULE INVERTER COMPRISING SAME

(71) Applicant: HANWHA SOLUTIONS CORPORATION, Seoul (KR)

(72) Inventor: Joong Tae Kim, Seoul (KR)

(73) Assignee: Hanwha Solutions Corporation, Seoul (KR)

( * ) Notice: Subject to any disclaimer, the term of this patent is extended or adjusted under 35 U.S.C. 154(b) by 0 days.

(21) Appl. No.: 19/108,996

(22) PCT Filed: Jan. 26, 2024

(86) PCT No.: PCT/KR2024/001293
§ 371 (c)(1),
(2) Date: Mar. 5, 2025

(87) PCT Pub. No.: WO2024/162706
PCT Pub. Date: Aug. 8, 2024

(65) Prior Publication Data
US 2025/0260364 A1    Aug. 14, 2025

(30) Foreign Application Priority Data

Jan. 30, 2023 (KR) .................. 10-2023-0011700

(51) Int. Cl.
*H05K 5/02* (2006.01)
*H02S 40/30* (2014.01)
*H02S 50/00* (2014.01)
(52) U.S. Cl.
CPC .............. *H02S 50/00* (2013.01); *H02S 40/30* (2014.12)

(58) Field of Classification Search
CPC ...................... H05K 5/0017; H05K 5/0217
USPC ......................... 361/807, 809, 810
See application file for complete search history.

(56) References Cited

U.S. PATENT DOCUMENTS

| 7,591,690 B1 * | 9/2009 | Chien ............... H02S 40/34 |
| | | 439/842 |
| 7,824,191 B1 | 11/2010 | Browder |
| 2003/0207622 A1 | 11/2003 | Gutierrez et al. |

(Continued)

FOREIGN PATENT DOCUMENTS

| CN | 104659534 A | 5/2015 |
| CN | 206432448 U | 8/2017 |

(Continued)

OTHER PUBLICATIONS

International Search Report for International Application No. PCT/KR2024/001293 dated May 1, 2024.

(Continued)

*Primary Examiner* — Hung S. Bui
(74) *Attorney, Agent, or Firm* — Harness, Dickey & Pierce, P.L.C.

(57) ABSTRACT

An electrical connector according to one aspect comprises: a first connector and a second connector, which are arranged such that connectors of an inverter and a power supply are electrically and physically coupled to or released from each other, a bracket for coupling the first connector and the second connector, a light source fastened to a hole included in the bracket; and a light source cover for protecting the light source.

12 Claims, 8 Drawing Sheets

(56) References Cited

U.S. PATENT DOCUMENTS

| | | | | |
|---|---|---|---|---|
| 2008/0283118 A1* | 11/2008 | Rotzoll | ................... | H02S 40/32 |
| | | | | 136/251 |
| 2013/0087690 A1* | 4/2013 | Sloey | ..................... | G02B 6/262 |
| | | | | 250/216 |
| 2014/0053892 A1* | 2/2014 | Seol | ....................... | H02S 50/00 |
| | | | | 136/251 |
| 2018/0006602 A1* | 1/2018 | Bunea | ..................... | H02S 40/34 |

FOREIGN PATENT DOCUMENTS

| | | | | | |
|---|---|---|---|---|---|
| KR | | 100888921 | B1 | 3/2009 | |
| KR | | 101039786 | B1 * | 6/2011 | ............... H01R 9/24 |
| KR | 10-2013-0021418 | A | | 3/2013 | |
| KR | | 101477685 | B1 | 12/2014 | |
| KR | | 101690040 | B1 | 1/2017 | |
| KR | 10-2017-0117910 | A | | 10/2017 | |
| KR | 10-2020-0011764 | A | | 2/2020 | |

OTHER PUBLICATIONS

Written Opinion of the International Searching Authority for International Application No. PCT/KR2024/001293 dated May 1, 2024.
Korean Notice of Allowance for Korean Application No. 10-2023-0011700 dated Dec. 29, 2024.
Korean Office Action for Korean Application No. 10-2023-0011700 dated Jun. 18, 2024.
Chinese Office Action dated Aug. 1, 2025 issued in Chinese Patent Application No. 202480004959.4 (English translation provided).

* cited by examiner

ELECTRICAL CONNECTOR AND SOLAR CELL MODULE INVERTER COMPRISING SAME

CROSS-REFERENCE TO RELATED APPLICATIONS

This application is a national phase under 35 U.S.C. § 371 of PCT International Application No. PCT/KR2024/001293 which has an International filing date of Jan. 26, 2024, which claims priority to Korean Application No. 10-2023-0011700, filed Jan. 30, 2023, the entire contents of each of which are hereby incorporated by reference.

TECHNICAL FIELD

The disclosure relates to an electrical connector and an inverter connected to a solar cell module including same.

BACKGROUND ART

A solar cell module may include a solar cell panel including solar cells, and a wiring box having components, circuits, or the like connected to the solar cell panel.

After installing a solar cell module, it may only be possible to check an operation state of the solar cell module when using a separate communication device, such as the web or an application. Because it is difficult to recognize an operation state of a solar cell module from the solar cell module itself, there is a problem that the solar cell module is not properly managed.

To solve such a problem, a solar cell module has been proposed which is provided with structures, components, or the like capable of checking an operation state. For example, a structure has been proposed in which a light source capable of indicating an operation state is provided in a solar cell module and the operation state of the solar cell module is checked by whether the light source is driven (i.e. whether the light source blinks, intervals, or the like).

To this end, a structure has been proposed in which a lens is positioned on a side wall of the wiring box, a side of an induction pipe with the light source inserted and a side of an induction pipe guide are fixed to a part of a wiring material, and another side of the induction pipe and another side of the induction pipe guide are connected to the lens.

In this way, a light source, a lens, an induction, an induction pipe, or the like are required to check an operation state of a solar cell module. In addition, for a waterproof, an O-ring is required between the lens and a case. In this way, as the number of parts in the device for checking an operation state of a solar cell module increases, the cost also increases. In addition, as a manufacturing process of the device becomes more complex, there is a problem of lower productivity.

DISCLOSURE

Technical Problem

Provided is an electrical connector having a function of indicating an operation of a solar cell module and included in an inverter for a solar cell module.

In addition, provided is an inverter for a solar cell module which may increase productivity by simplifying an internal configuration.

The problems to be solved by the disclosure are not limited to the problems mentioned above, and other problems not mentioned herein will be clearly understood by those skilled in the art from the description below.

Technical Solution

An electrical connector according to an aspect includes: a first connector and a second connector, which are arranged such that connectors of an inverter and a power supply are electrically and physically coupled to or released from each other; a bracket for coupling the first connector and the second connector; a light source fastened to a hole included in the bracket; and a light source cover for protecting the light source.

In the electrical connector described above, the light source cover may include a body and at least one pin protruding from the body, and the bracket may include at least one groove in which the pin is arranged.

An inverter for a solar cell module according to another aspect includes: a substrate on which a light source in communication with the operation of a solar cell module is arranged; a case including the substrate therein; a bracket mounted to the case; a first connector and a second connector coupled to the bracket; and a light source cover coupled to the bracket, wherein the first connector includes a first step surface, a second step surface spaced apart from the first step surface, a third step surface spaced apart from the second step surface, a first tooth connecting the first step surface and the second step surface, and a first outer circumferential surface connecting the second step surface and the third step surface, and the second connector includes a fourth step surface, a fifth step surface spaced apart from the fourth step surface, a sixth step surface spaced apart from the fifth step surface, a second tooth connecting the fourth step surface and the fifth step surface, and a second outer circumferential surface connecting the fifth step surface and the sixth step surface, and the bracket includes a first contact surface contacting the first step surface, a third tooth engaging with the first tooth, a second contact surface contacting the second step surface, a third contact surface contacting the third step surface, a fourth contact surface contacting the fourth step surface, a fourth tooth engaging with the second tooth, a fifth contact surface contacting the fifth step surface, and a sixth contact surface contacting the sixth step surface, and the bracket includes a hole, and an emission portion of the light source is arranged in the hole and exposed to the outside of the case, and the light source cover covers the emission portion.

In the inverter for a solar cell module described above, the light source may include a support portion connected to the emission portion, and the support portion may be connected to the substrate.

In the inverter for a solar cell module described above, the light source cover may include a body at least one pin protruding from the body, and the bracket may include at least one groove in which the pin is arranged.

In the inverter for a solar cell module described above, the hole and the groove may be arranged on a back surface of the bracket, and the groove may be arranged along a perimeter of the hole.

In the inverter for a solar cell module described above, an inner diameter of the groove may be smaller than an inner diameter of the hole.

In the inverter for a solar cell module described above, the bracket may include a seventh contact surface contacting first outer circumferential surface and an eighth contact surface contacting the second outer circumferential surface.

In the inverter for a solar cell module described above, the first connector may include a third outer circumferential surface connected to the third step surface, and the bracket may include a ninth contact surface contacting the third outer circumferential surface.

In the inverter for a solar cell module described above, an outer diameter of the third outer circumferential surface may be smaller than an outer diameter of the first outer circumferential surface.

In the inverter for a solar cell module described above, the second connector may include a fourth outer circumferential surface connected to the sixth step surface, and the bracket may include a tenth contact surface contacting the fourth outer circumferential surface.

In the inverter for a solar cell module described above, an outer diameter of the fourth outer circumferential surface may be smaller than an outer diameter of the third outer circumferential surface.

Advantageous Effects

According to an embodiment, a lens portion and a bracket including a connector and an induction pipe may be manufactured by integral injection-molding, thereby simplifying a configuration and increasing productivity.

According to an embodiment, a light source may be exposed directly from the bracket, thereby improving visibility.

According to an embodiment, a lens portion and a bracket including a connector and an induction pipe may be manufactured by integral injection-molding, thereby facilitating assembly.

According to an embodiment, a lens portion and a bracket including a connector and an induction pipe may be manufactured by integral injection-molding, thereby improve waterproof performance.

BEST MODE

Figure 1:
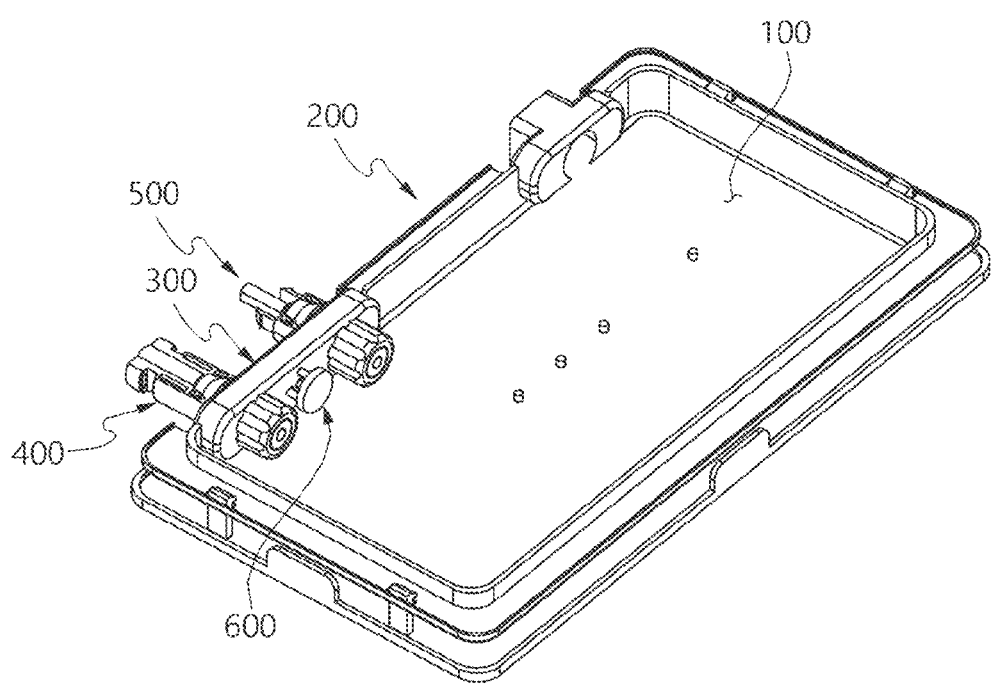
FIG. 1 is a diagram illustrating an inverter for a solar cell module according to an embodiment.

An electrical connector according to one aspect includes: a first connector and a second connector, which are arranged such that connectors of an inverter and a power supply are electrically and physically coupled to or released from each other; a bracket for coupling the first connector and the second connector; a light source fastened to a hole included in the bracket; and a light source cover for protecting the light source.

MODE FOR INVENTION

Hereinafter, preferred embodiments of the disclosure will be described in detail with reference to the attached drawings.

However, the technical idea of the disclosure is not limited to some of the embodiments described, but may be implemented in various different forms, and in the scope of the technical idea of the disclosure, one or more of the components among the embodiments may be selectively combined or substituted for use.

In addition, terms (including technical and scientific terms) used in the embodiments of the disclosure may be interpreted as having a meaning that may be generally understood by a person of ordinary skill in the technical field to which the disclosure belongs, unless explicitly and specifically defined and described, and terms which are commonly used, such as terms defined in a dictionary, may be interpreted in consideration of the contextual meaning of the related art.

In addition, the terms used in the embodiments of the disclosure are for the purpose of describing the embodiments and are not intended to limit the disclosure.

In this specification, the singular may also include the plural unless specifically stated otherwise in a phrase, and in case that it is described as 'at least one (or one or more) of A, B, or C', it may include one or more of all combinations which may be combined with A, B, and C.

In addition, in describing components of embodiments of the disclosure, terms, such as first, second, A, B, (a), (b), or the like may be used.

These terms are only intended to distinguish one component from another, and are not intended to limit the nature, order, or sequence of the component.

In addition, in case that a component is described as being 'connected', 'coupled' or 'linked' to another component, it may include not only cases where the component is directly connected, coupled or linked to the other component, but also cases where the component is 'connected', 'coupled' or 'linked' by another component between the component and the other component.

In addition, in case that it is described as being included or arranged 'upper (above) or lower (below)' each component, 'upper (above) or lower (below)' may include not only cases where two components are in direct contact with each other, but also cases where one or more other components are included or arranged between the two components. In addition, in case that it is expressed as 'upper (above) or lower (below)', it may include the meaning of not only an upward direction but also a downward direction based on one component.

FIG. 1 is a diagram illustrating an inverter for a solar cell module according to an embodiment.

Referring to FIG. 1, an inverter for a solar cell module (hereinafter referred to as an 'inverter') may include a substrate 100, a case 200, a bracket 300, a first connector 400, a second connector 500, and a light source cover 600. For example, an inverter may be connected to a solar cell module.

An inverter may convert current, voltage, or power generated by a solar cell module. In this regard, the conversion may be changing a value and/or type of current, voltage or power. For example, an inverter may change a value of current, voltage, or power to another value. In addition, an inverter may change current, voltage, or power from direct current to alternating current or from alternating current to direct current. The current, voltage, or power source converted by the inverter may be transmitted externally through a cable.

A light source in communication with the operation of a solar cell module may be arranged on a substrate 100. For example, light irradiated from a light source may be a signal indicating an operation state of a solar cell module. That is, the operating status of a solar cell module may be output through various expression methods using light.

As an example, a normal operation of a solar cell module may be expressed by turning the light on/off. For example, in case that a solar cell module is operating normally, a light source 110 may remain off, and in case that there is a problem with the solar cell module, the light source 110 may be turned on. In addition, in case that a solar cell module is operating normally, the light source 110 may remain on, and in case that there is a problem with the solar cell module, the light source 110 may be turned off.

As another example, various behavioral problems of a solar cell module may be expressed depending on time of irradiating light, a color of the light, and an intensity of the light. For example, light may be irradiated at different time intervals, different colors, and/or different intensities depending on which element among elements included in a solar cell module is experiencing a problem.

Any device which may be irradiated with light may be considered as a light source without limitation. For example, a light source may be implemented as a liquid crystal display (LCD), a light emitting diode (LED), an organic light emitting diode (OLED), a quantum dot light emitting diode (QLED), a μLED, or the like.

A substrate 100 may be accommodated inside a case 200.

A bracket 300 may be coupled to the case 200 to support a first connector 400, a second connector 500, and a light source cover 600.

The first connector 400 and the second connector 500 may be coupled to the bracket 300 and may be a female connector or a male connector.

A light source cover 600 may cover a light source arranged on the bracket 300 and may secure a light source 110.

Hereinafter, with reference to FIGS. 2 to 8, an example of an electrical connector 700 including a bracket 300, a first connector 400, a second connector 500, a light source cover 600, and a light source 110 will be described.

Figure 2:
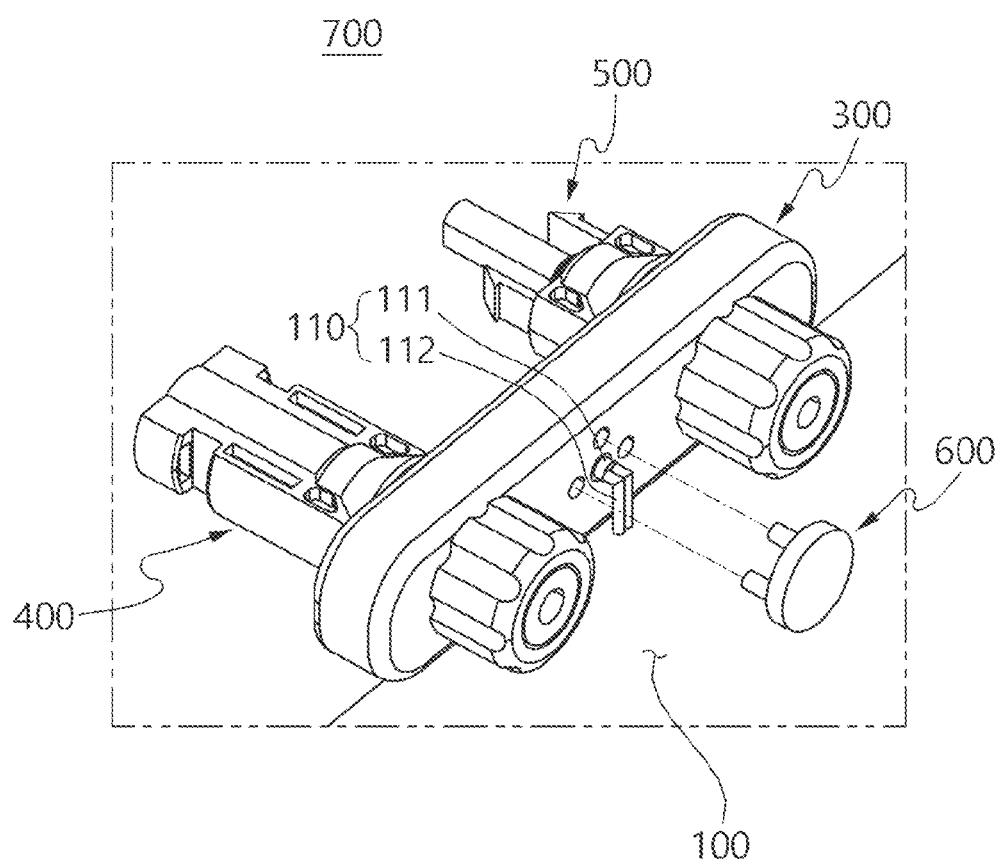
FIG. 2 is a perspective view of an electrical connector according to an embodiment.
Figure 3:
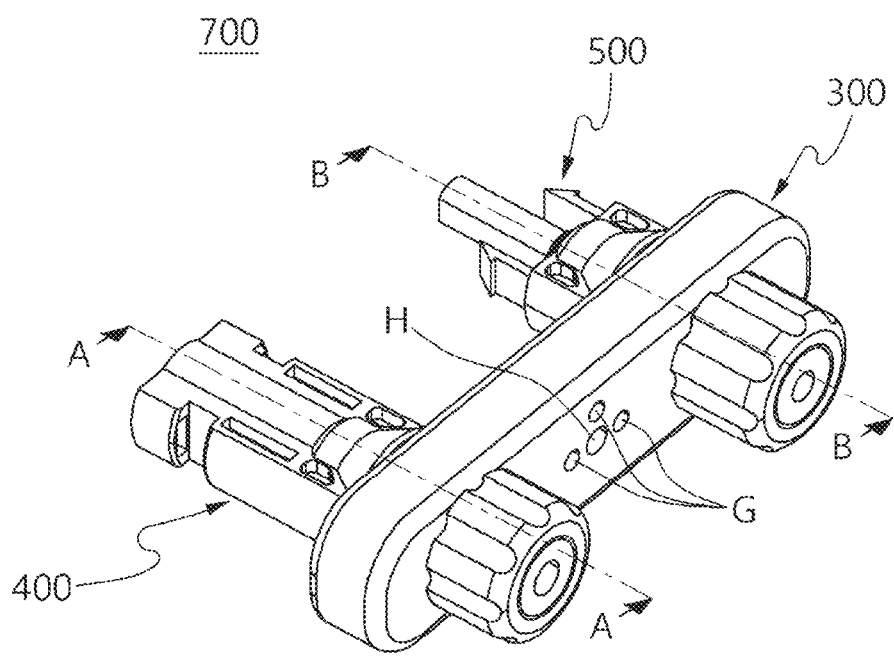
FIG. 3 is a drawing illustrating a bracket, a first connector, and a second connector according to an embodiment.
Figure 4:
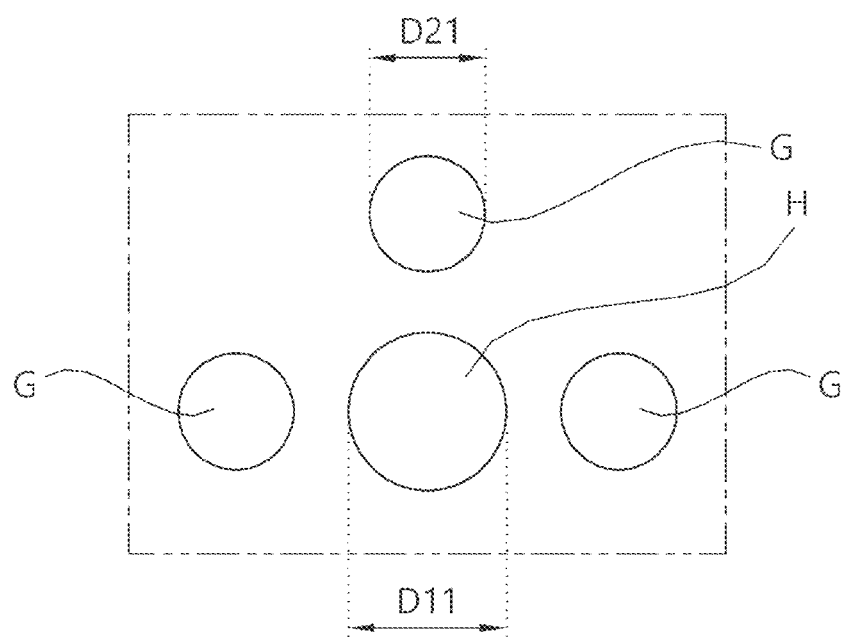
FIG. 4 is a drawing illustrating a groove and hole of a bracket according to an embodiment.

FIG. 2 is a perspective view of an electrical connector according to an embodiment, FIG. 3 is a drawing illustrating a bracket, a first connector, and a second connector according to an embodiment, and FIG. 4 is a drawing illustrating a groove and a hole of the bracket according to an embodiment.

Referring to FIG. 2, an electrical connector 700 may include a bracket 300, a first connector 400, a second connector 500, and a light source cover 600.

The first connector 400 and the second connector 500 are arranged such that connectors of an inverter and a power supply are electrically and physically coupled to or released from each other.

A light source 110 may include an emission portion 111 and a support portion 112. For example, the emission portion 111 may be arranged directly on the bracket 300 and exposed to the outside. The support portion 112 may be arranged such that the emission portion 111 is connected to the substrate 100. In FIG. 2, the support portion 112 is illustrated as having an "l" shape, but is not limited thereto. The support portion 112 may be implemented in various shapes so that the emission portion 111 is connected to the substrate 100.

As an example, the bracket 300, the first connector 400 and the second connector 500 may be integrally molded and implemented as one part. By injection molding in a state that the first connector 400 and the second connector 500 are aligned side by side, the first connector 400, the second connector 500, and the bracket 300 may be molded integrally. Afterwards, the light source 110 and the light source cover 600 may be assembled to the bracket 300. At least one of the first connector 400 or the second connector 500 may be included to protrude from the bracket 300.

In case that the first connector 400, the second connector 500, and the bracket 300 are molded integrally, a structure of the electrical connector 700 may be simplified. Accordingly, productivity of the electrical connector 700 may be increased, and waterproof performance of the electrical connector 700 may also be improved.

As another example, at least one of the bracket 300, the first connector 400, or the second connector 500 may be implemented as an independent part.

The bracket 300 may be manufactured from a material which does not deform after molding. For example, the bracket 300 may be manufactured from a plastic resin of the bracket 300, but is not limited thereto.

Referring to FIGS. 3 and 4, the bracket 300 may include a hole H and grooves G.

The hole H may penetrate through a front and rear of the bracket 300. Because an emission portion 111 of a light source 110 is positioned in the hole H, the emission portion 111 may be directly exposed to the outside through the hole H. Accordingly, a user may easily identify light emitted from the emission portion 111. In FIG. 3, it is illustrated that there is one hole H, but it is not limited thereto. In other words, there is no limitation on the number and arrangement of holes H when the light emitted from the emission portion 111 may be easily identified by the user.

The grooves G are used to couple a light source cover 600 to the bracket 300. For example, the number of grooves G may be plural. In this case, a plurality of grooves G may be arranged along a perimeter of a hole H or may be arranged concentrated on a side of the hole H. In FIG. 3, it is illustrated that there are three grooves G, but it is not limited thereto. There is no limitation on the number and arrangement of the grooves G when the light source cover 600 may be stably coupled to the bracket 300.

In FIG. 4, an inner diameter D21 of a groove G is illustrated as being smaller than an inner diameter D11 of a hole H, but is not limited thereto. In other words, the inner diameter D21 may be larger than the inner diameter D11, or the inner diameter D21 and the inner diameter D11 may be identical.

Figure 5:
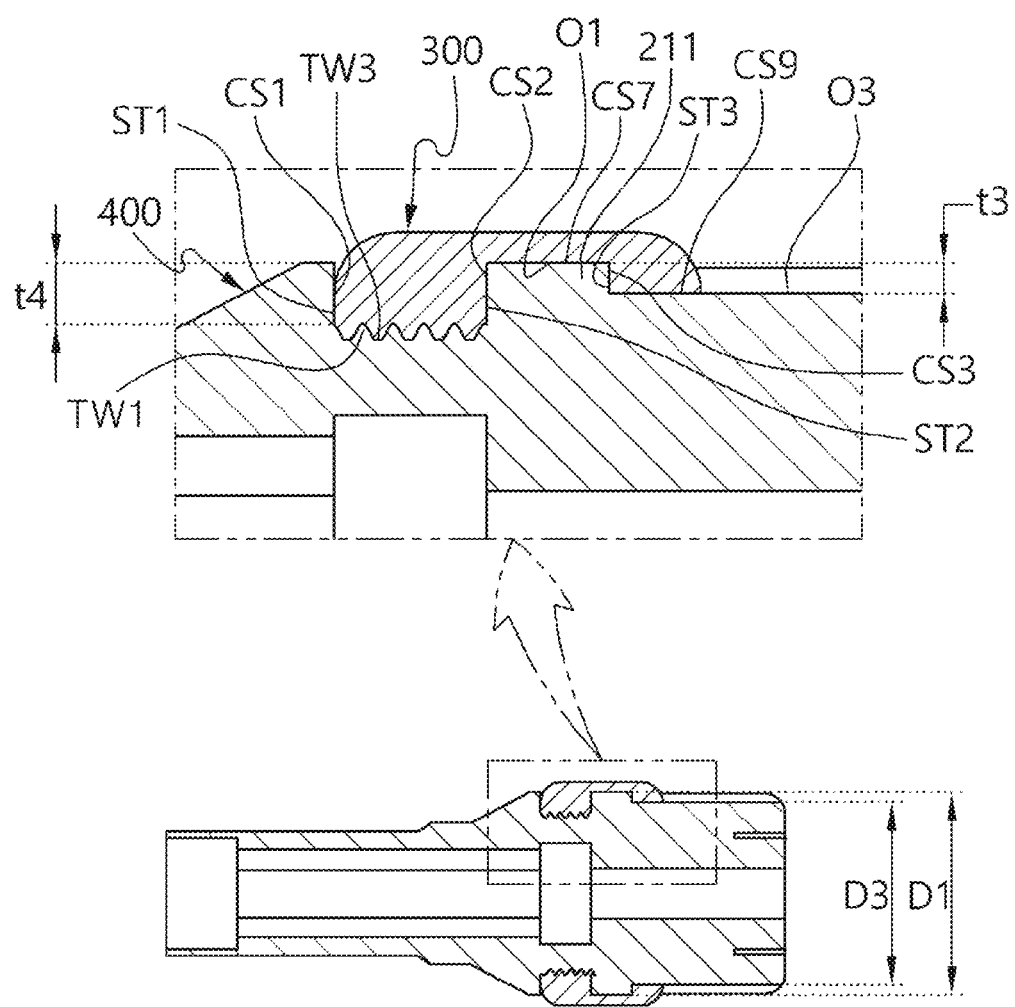
FIG. 5 is a sectional side view taken along a virtual line A-A of FIG. 3.

FIG. 5 is a sectional side view taken along a virtual line A-A of FIG. 3.

Referring to FIG. 5, the first connector 400 may include a first step surface ST1, a second step surface ST2, and a third step surface ST3. In addition, the first connector 400 may include a first tooth TW1, a first outer circumferential surface O1, and a third outer circumferential surface O3.

For example, the first step surface ST1, the second step surface ST2, and the third step surface ST3 may each be annular. In addition, the second step surface ST2 may be spaced apart from the first step surface ST1, and the third step surface ST3 may be spaced apart from the second step surface ST2.

For example, the first tooth TW1 may connect the first step surface ST1 and the second step surface ST2. In addition, the first outer circumferential surface O1 is cylindrical and may connect the second step surface ST2 and the third step surface ST3. In addition, the third outer circumferential surface O3 is cylindrical and may be connected to the third step surface ST3.

The bracket 300 may include a first contact surface CS1, a second contact surface CS2, a third contact surface CS3, a seventh contact surface CS7, and a ninth contact surface CS9.

For example, the first contact surface CS1 may contact the first step surface ST1, and the first contact surface CS1 may be annular. In addition, the second contact surface CS2 may contact the second step surface ST2, and the second contact surface CS2 may be annular. In addition, the third contact surface CS3 may contact the third step surface ST3, and the third contact surface CS3 may be annular. In addition, the seventh contact surface CS7 may contact the first outer circumferential surface O1, and the ninth contact surface CS9 may contact the third outer circumferential surface O3. The seventh contact surface CS7 and the ninth contact surface CS9 may each be cylindrical.

In addition, the bracket 300 may include a third tooth TW3, and the third tooth TW3 may connect the first contact surface CS1 and the second contact surface CS2.

For example, the first tooth TW1 and the third tooth TW3 may engage with each other in a direction increasing an area in which the bracket 300 and the first connector 400 are in contact with each other. Accordingly, a coupling force between the bracket 300 and the first connector 400 may be increased. In FIG. 5, the first tooth TW1 and the third tooth TW3 are each illustrated as being included in a sawtooth shape, but are not limited thereto. The first tooth TW1 and the third tooth TW3 may be manufactured in various shapes, such as a wave shape, an uneven shape, or the like to increase a surface area in contact with each other.

In FIG. 5, an outer diameter D3 of the third outer circumferential surface O3 is shown to be smaller than an outer diameter D1 of the first outer circumferential surface O1, and a radial thickness t3 of the third step surface ST3 is shown to be smaller than a radial thickness t1 of the first step surface ST1, but this is not limited thereto.

Figure 6:
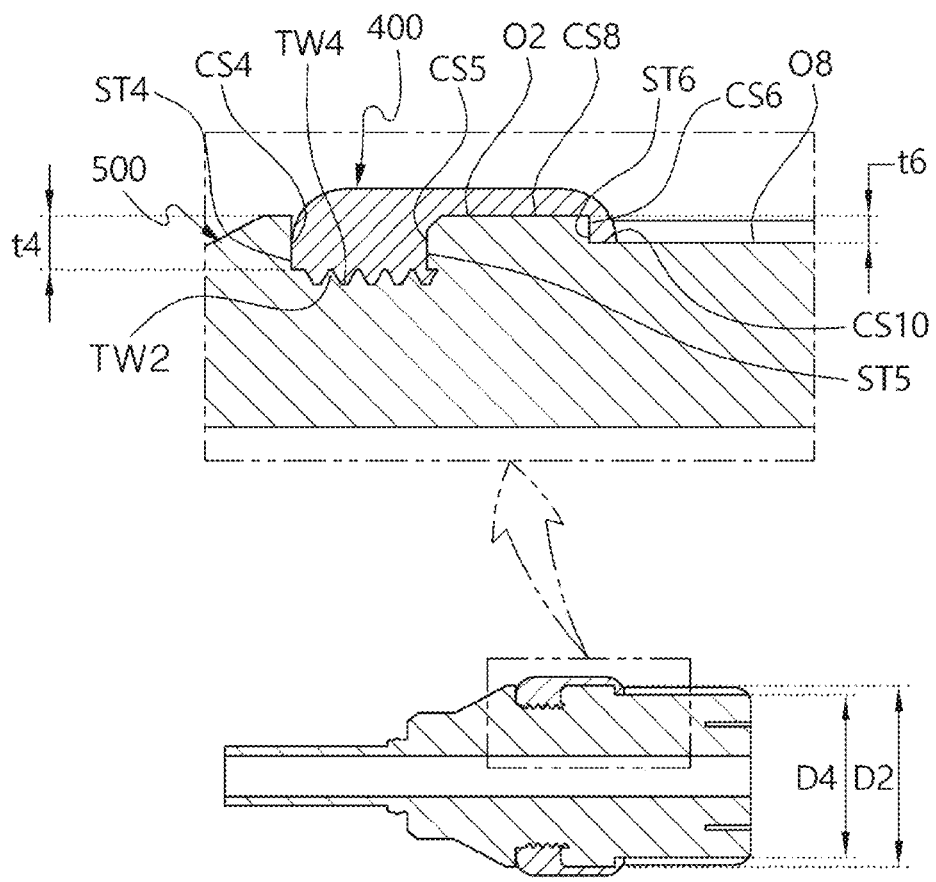
FIG. 6 is a sectional side view taken along a virtual line B-B of FIG. 3.

FIG. 6 is a sectional side view taken along a virtual line B-B of FIG. 3.

Referring to FIG. 6, the second connector 500 may include a fourth step surface ST4, a fifth step surface ST5, and a sixth step surface ST6. In addition, the second connector 500 may include a second tooth TW2, a second outer circumferential surface O2, and a fourth outer circumferential surface O4.

For example, the fourth step surface ST4, the fifth step surface ST5, and the sixth step surface ST6 may each be annular. In addition, the fifth step surface ST5 may be spaced apart from the fourth step surface ST4, and the sixth step surface ST6 may be spaced apart from the fifth step surface ST5.

For example, the second tooth TW2 may connect the fourth step surface ST4 and the fifth step surface ST5. In addition, the second outer circumferential surface O2 is cylindrical and may connect the fifth step surface ST5 and the sixth step surface ST6. In addition, the fourth outer circumferential surface O4 is cylindrical and may be connected to the sixth step surface ST6.

The bracket 300 may include a fourth contact surface CS4, a fifth contact surface CS5, a sixth contact surface CS6, an eighth contact surface CS8, and a tenth contact surface CS10.

For example, the fourth contact surface CS4 may contact the fourth step surface ST4, and the fourth contact surface CS4 may be annular. In addition, the fifth contact surface CS5 may contact the fifth step surface ST5, and the fifth contact surface CS5 may be annular. In addition, the sixth contact surface CS6 may contact the sixth step surface ST6, and the sixth contact surface CS6 may be annular. In addition, the eighth contact surface CS8 may contact the second outer circumferential surface O2. In addition, the tenth contact surface CS10 may contact the fourth outer circumferential surface O4, and the eighth contact surface CS8 and the tenth contact surface CS10 may each be cylindrical.

In addition, the bracket 300 may include a fourth tooth TW4, and the fourth tooth TW4 may connect the fourth contact surface CS4 and the fifth contact surface CS5.

For example, the second tooth TW2 and the fourth tooth TW4 may engage with each other in a direction increasing an area in which the bracket 300 and the second connector 500 are in contact with each other. Accordingly, a coupling force between the bracket 300 and the second connector 500 may be increased. In FIG. 6, the second tooth TW2 and the fourth tooth TW4 are each illustrated as being included in a sawtooth shape, but are not limited thereto. The second tooth TW2 and the fourth tooth TW4 may be manufactured in various shapes, such as a wave shape, an uneven shape, or the like to increase a surface area in contact with each other.

In FIG. 6, an outer diameter D4 of the fourth outer circumferential surface O4 is shown to be smaller than an outer diameter D2 of the second outer circumferential surface O2, and a radial thickness t6 of the sixth step surface ST6 is shown smaller than a radial thickness t4 of the fourth step surface ST4, but this is not limited thereto.

Figure 7:
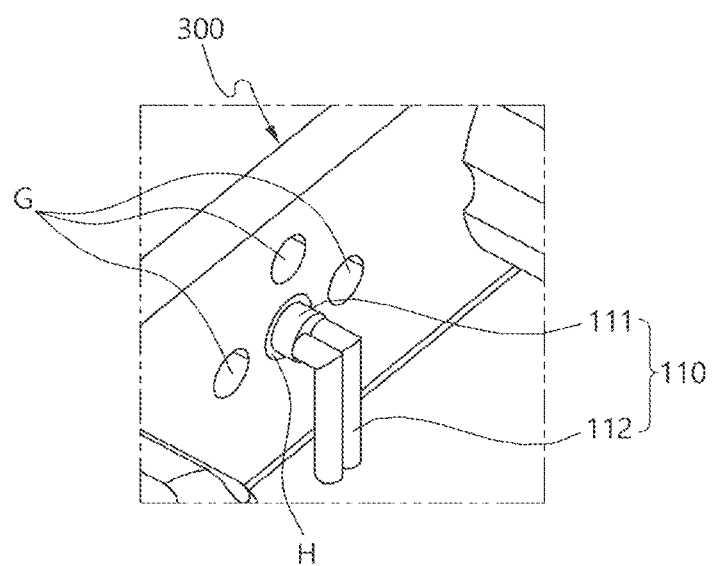
FIG. 7 is an enlarged view of a bracket and a light source according to an embodiment.
Figure 8:
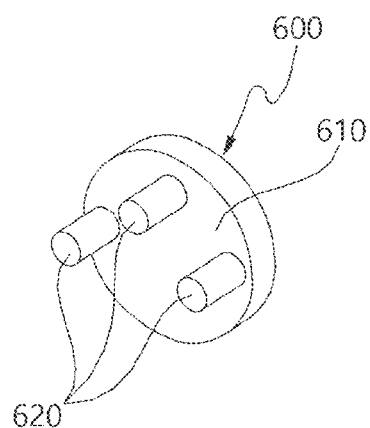
FIG. 8 is a drawing illustrating a light source cover according to an embodiment.

FIG. 7 is an enlarged view of a bracket and a light source according to an embodiment, and FIG. 8 is a drawing illustrating a light source cover according to an embodiment.

Referring to FIG. 7, the emission portion 111 of the light source 110 is arranged in a hole H of the bracket 300, and the support portion 112 is connected to the substrate 100. In addition, grooves G are arranged along a perimeter of a hole H. Referring to FIG. 8, the light source cover 600 may include a body 610 and at least one pin 620 protruding from the body 610.

An arrangement of pins 620 in the body 610 may correspond to an arrangement of grooves G in the bracket 300. For example, because the grooves G in FIG. 7 are arranged in a triangular shape, the pins 620 may also be arranged in a triangular shape. Accordingly, the pins 620 may be inserted into the grooves G to couple the light source cover 600 and the bracket 300. However, the arrangement of the grooves G and the arrangement of the pins 620 are not limited to those shown in FIGS. 7 and 8. In other words, there is no limitation on the number and arrangement of pins 620 and grooves G when the pins 620 may be inserted into the grooves G.

It should be understood that the above-described embodiments of the disclosure are illustrative in all respects and not restrictive, and the scope of the disclosure is indicated by the claims described below rather than by the detailed description described above. In addition, the meaning and scope of the claims, as well as all changes or modifications derived from the equivalent concept, should be interpreted as being included in the scope of the disclosure.

The invention claimed is:
1. An electrical connector included in an inverter, the electrical connector comprising:
 a first connector and a second connector that enable electrical and physical connection and disconnection between the inverter and a connector of a power source;

a bracket coupled to the first connector and the second connector to have an integral structure;
a light source fastened to a hole formed in the bracket to be exposed to outside; and
a light source cover that protects the light source,
wherein the first connector and the second connector are formed to protrude more than the bracket in forward and backward directions of the bracket, and
the light source indicates an operating state of a solar cell module connected to the inverter.

2. The electrical connector of claim 1, wherein
the light source cover comprises a disc-shaped body and a plurality of pins protruding from the disc-shaped body, and
the bracket comprises a plurality of grooves in which the pins are arranged.

3. An inverter for a solar cell module comprises:
a substrate on which a light source in communication with an operation of a solar cell module is arranged;
a case including the substrate therein;
a bracket mounted on the case;
a first connector and a second connector coupled to the bracket; and
a light source cover coupled to the bracket, wherein
the first connector includes a first step surface, a second step surface spaced apart from the first step surface, a third step surface spaced apart from the second step surface, a first tooth connecting the first step surface and the second step surface, and a first outer circumferential surface connecting the second step surface and the third step surface, and
the second connector includes a fourth step surface, a fifth step surface spaced apart from the fourth step surface, a sixth step surface spaced apart from the fifth step surface, a second tooth connecting the fourth step surface and the fifth step surface, and a second outer circumferential surface connecting the fifth step surface and the sixth step surface, and
the bracket includes a first contact surface contacting the first step surface, a third tooth engaging with the first tooth, a second contact surface contacting the second step surface, a third contact surface contacting the third step surface, a fourth contact surface contacting the fourth step surface, a fourth tooth engaging with the second tooth, a fifth contact surface contacting the fifth step surface, and a sixth contact surface contacting the sixth step surface, and
the bracket includes a hole, an emission portion of the light source is arranged in the hole and exposed to an outside of the case, and the light source cover covers the emission portion.

4. The inverter for a solar cell module of claim 3, wherein
the light source includes a support portion connected to the emission portion, and the support portion is connected to the substrate.

5. The inverter for a solar cell module of claim 4, wherein
the light source cover includes a body at least one pin protruding from the body, and
the bracket includes at least one groove in which the pin is arranged.

6. The inverter for a solar cell module of claim 5, wherein
the hole and the groove are arranged on a back surface of the bracket, and the groove is arranged along a perimeter of the hole.

7. The inverter for a solar cell module of claim 6, wherein
an inner diameter of the groove is smaller than an inner diameter of the hole.

8. The inverter for a solar cell module of claim 7, wherein
the bracket includes a seventh contact surface contacting first outer circumferential surface and an eighth contact surface contacting the second outer circumferential surface.

9. The inverter for a solar cell module of claim 8, wherein
the first connector includes a third outer circumferential surface connected to the third step surface, and
the bracket includes a ninth contact surface contacting the third outer circumferential surface.

10. The inverter for a solar cell module of claim 9, wherein
an outer diameter of the third outer circumferential surface is smaller than an outer diameter of the first outer circumferential surface.

11. The inverter for a solar cell module of claim 10, wherein
the second connector includes a fourth outer circumferential surface connected to the sixth step surface, and
the bracket includes a tenth contact surface contacting the fourth outer circumferential surface.

12. The inverter for a solar cell module of claim 11, wherein
an outer diameter of the fourth outer circumferential surface is smaller than an outer diameter of the third outer circumferential surface.

* * * * *